(12) United States Patent
Kim

(10) Patent No.: US 10,861,576 B2
(45) Date of Patent: Dec. 8, 2020

(54) NONVOLATILE MEMORY DEVICE, OPERATING METHOD THEREOF AND DATA STORAGE DEVICE INCLUDING THE SAME

(71) Applicant: SK hynix Inc., Gyeonggi-do (KR)

(72) Inventor: Jee Yul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 84 days.

(21) Appl. No.: 16/153,079

(22) Filed: Oct. 5, 2018

(65) Prior Publication Data

US 2019/0295681 A1 Sep. 26, 2019

(30) Foreign Application Priority Data

Mar. 21, 2018 (KR) .................. 10-2018-0032539

(51) Int. Cl.
*G11C 29/42* (2006.01)
*G11C 29/36* (2006.01)
*G11C 29/44* (2006.01)

(52) U.S. Cl.
CPC .............. *G11C 29/42* (2013.01); *G11C 29/36* (2013.01); *G11C 29/44* (2013.01)

(58) Field of Classification Search
None
See application file for complete search history.

(56) References Cited

U.S. PATENT DOCUMENTS

| 10,037,244 B2* | 7/2018 | Chung | G06F 3/064 |
| 10,044,475 B2* | 8/2018 | Chung | H04L 1/24 |
| 10,355,833 B2* | 7/2019 | Chung | H04L 1/24 |
| 10,504,606 B2* | 12/2019 | Kwon | G11C 29/38 |
| 2016/0378597 A1* | 12/2016 | Chung | G11C 29/52 714/764 |
| 2018/0322008 A1* | 11/2018 | Chung | G06F 11/1068 |
| 2019/0288805 A1* | 9/2019 | Chung | G11C 29/52 |

FOREIGN PATENT DOCUMENTS

KR 101336345 12/2013

* cited by examiner

*Primary Examiner* — Phung M Chung
(74) *Attorney, Agent, or Firm* — IP & T Group LLP

(57) ABSTRACT

A nonvolatile memory device includes a memory cell array; a peripheral circuit configured to perform an operation corresponding to a command provided from an external device, for the memory cell array; a fail occurrence register configured to store fail occurrence information for intentionally causing an operation fail to occur; and a control logic configured to store the fail occurrence information in the fail occurrence register based on a fail occurrence command received from the external device, control the peripheral circuit to perform a test operation corresponding to a test operation command received from the external device, for the memory cell array, and control the peripheral circuit to cause an intentional fail to occur in the test operation, based on the fail occurrence information.

10 Claims, 8 Drawing Sheets

FIG.3
180
| Fail Flag Bit | Fail Operation Type | Fail Condition |
|---|---|---|
| Set/Reset | Operation Code | Pulse Count, Verify Count, Operation Time, PV Level, Verify Level, UECC ... |
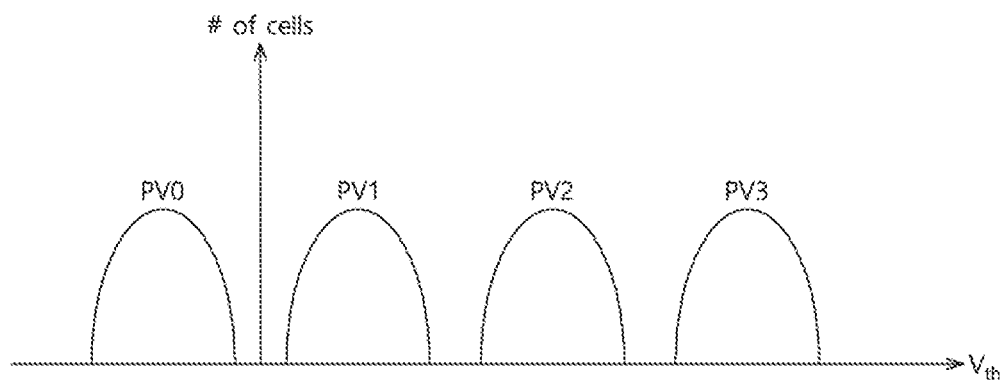
FIG.4A
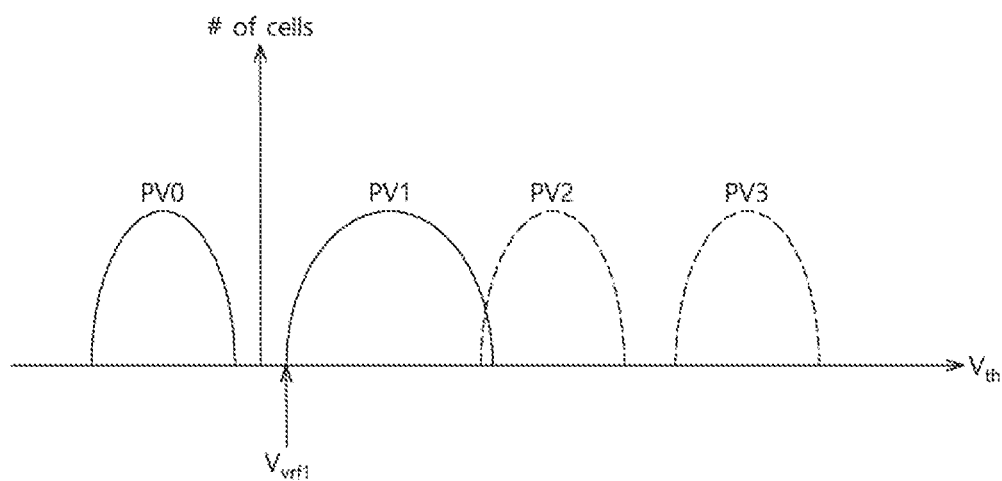
FIG.4B

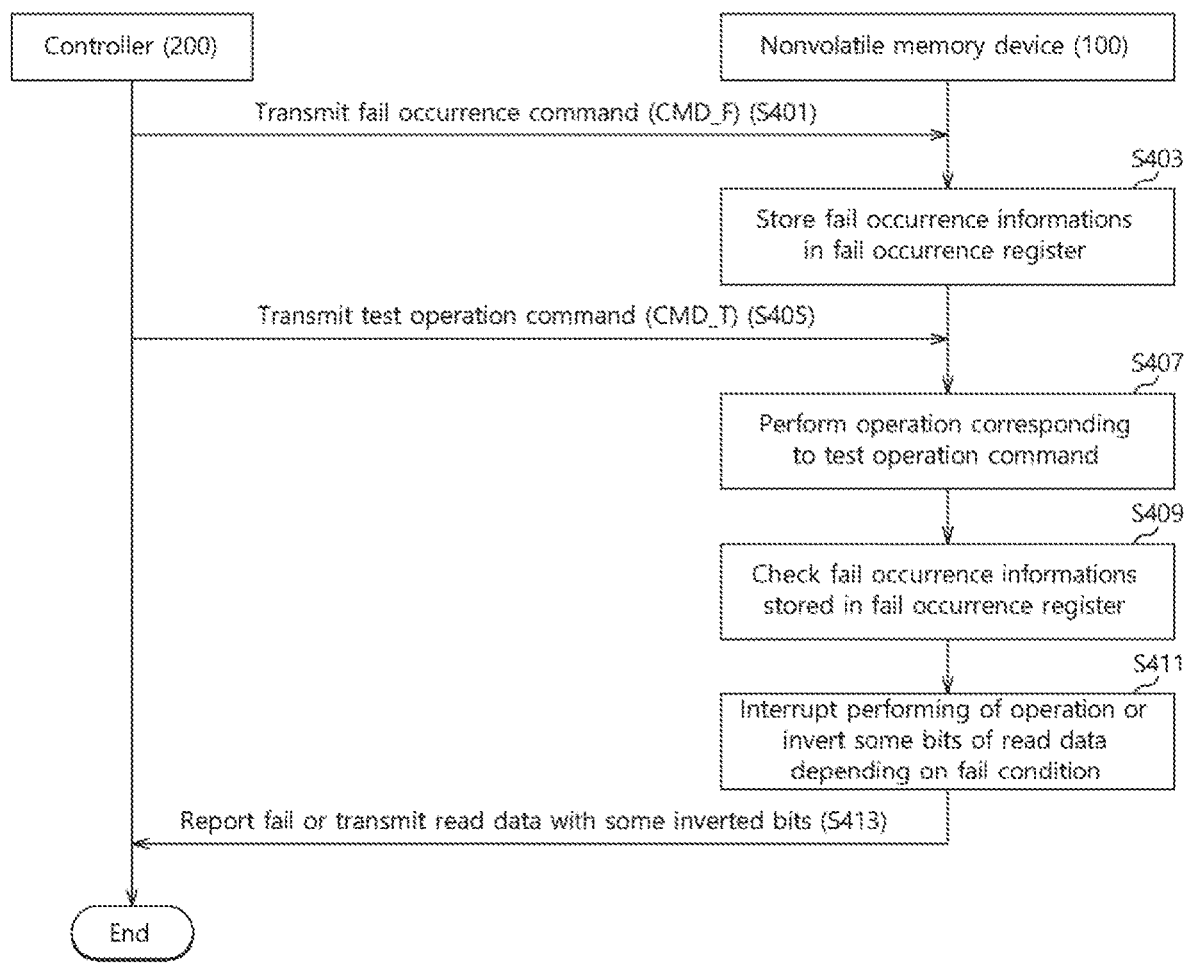

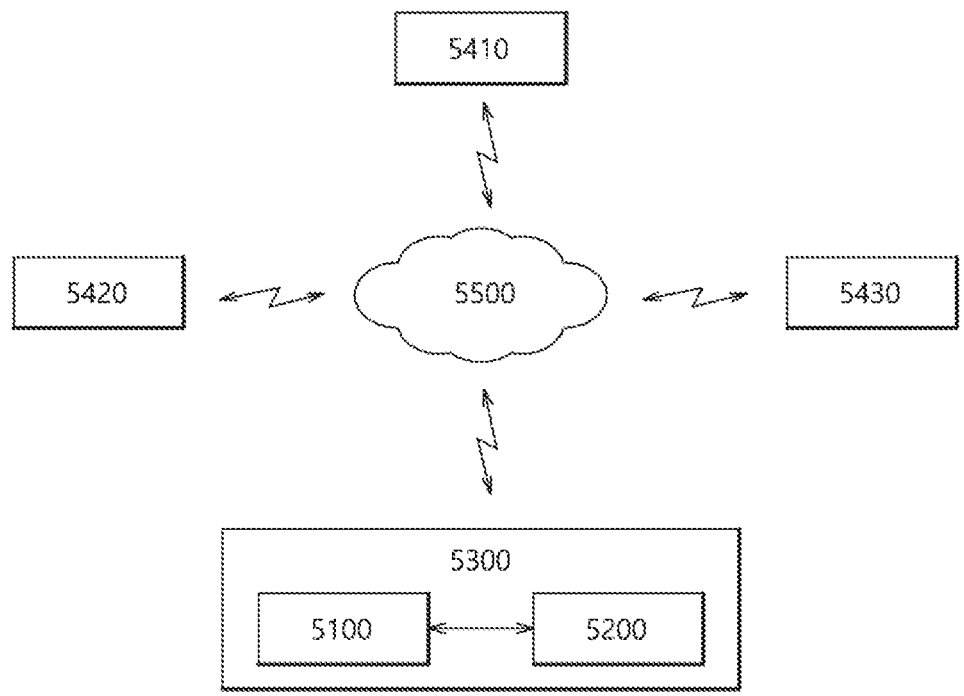

NONVOLATILE MEMORY DEVICE, OPERATING METHOD THEREOF AND DATA STORAGE DEVICE INCLUDING THE SAME

CROSS-REFERENCE TO RELATED APPLICATION

The present application claims priority under 35 U.S.C. § 119(a) to Korean application number 10-2018-0032539, filed on Mar. 21, 2018, in the Korean Intellectual Property Office, which is incorporated herein by reference in its entirety.

BACKGROUND

1. Technical Field

Various embodiments of the present invention generally relate to a semiconductor device. Particularly, the embodiments relate to a nonvolatile memory device, an operating method thereof and a data storage device including the same.

2. Related Art

Recently, the computer environment paradigm has been shifting to ubiquitous computing in which computer systems can be used anytime and anywhere. As a result, the use of portable electronic devices such as mobile phones, digital cameras, and laptop computers has rapidly increased. In general, such portable electronic devices use a data storage device which uses a memory device. A data storage device is used to store data to be used in a portable electronic device.

Since there is no mechanical driving part, a data storage device using a memory device provides advantages such as excellent stability and durability, high information access speed, and low power consumption. Data storage devices having such advantages include a universal serial bus (USB) memory device, memory cards having various interfaces, a universal flash storage (UFS) device, and a solid state drive (SSD).

SUMMARY

Various embodiments are directed to a nonvolatile memory device capable of shortening a verification time of a flash translation layer (FTL) and verifying various types of fail, an operating method thereof and a data storage device including the same.

In an embodiment, a nonvolatile memory device may include: a memory cell array; a peripheral circuit configured to perform an operation corresponding to a command provided from an external device, for the memory cell array; a fail occurrence register configured to store fail occurrence information for intentionally causing an operation fail to occur; and a control logic configured to store the fail occurrence information in the fail occurrence register based on a fail occurrence command received from the external device, control the peripheral circuit to perform a test operation corresponding to a test operation command received from the external device, for the memory cell array, and control the peripheral circuit to cause an intentional fail to occur in the test operation, based on the fail occurrence information.

In an embodiment, a method for operating a nonvolatile memory device may include: receiving a fail occurrence command from an external device; storing fail occurrence information in a fail occurrence register based on the fail occurrence command; receiving a test operation command from the external device; performing a test operation corresponding to the test operation command; checking the fail occurrence information; and causing a fail to occur for the test operation, based on the fail occurrence information.

In an embodiment, a data storage device may include: a nonvolatile memory device and a controller which controls an operation of the nonvolatile memory device. The nonvolatile memory device may include: a memory cell array; a peripheral circuit configured to perform an operation corresponding to a command provided from an external device, for the memory cell array; a fail occurrence register configured to store fail occurrence information for intentionally causing an operation fail to occur; and a control logic configured to store the fail occurrence information in the fail occurrence register based on a fail occurrence command received from the controller, control the peripheral circuit to perform a test operation corresponding to a test operation command received from the controller, for the memory cell array, and control the peripheral circuit to cause an intentional fail to occur in the test operation, based on the fail occurrence information.

In an embodiment, a data storage device may include: a memory cell array; a peripheral circuit; a register configured to store information including whether to cause a fail to occur, a type of an operation to cause the fail to occur, and a condition for the fail to occur; a control logic configured to control the peripheral circuit to perform an operation to the memory cell array; and a controller configured to provide the control logic with a test command. The control logic is further configured to control the peripheral circuit to cause the fail during the operation of the type according to the information in response to the test command and to report the fail to the controller. The controller drives a flash translation layer (FTL) to process the fail thereby verifying a result of the process of the flash translation layer.

According to the embodiments, a fail desired to be verified for a nonvolatile memory device may be caused to occur in a desired type at a desired point of time. Due to this fact, a time for verifying the driving of a flash translation layer (FTL) may be shortened, and at the same time, it is possible to verify various types of fail.

BRIEF DESCRIPTION OF THE DRAWINGS

FIG. 3 is a diagram illustrating an example of a configuration of a fail occurrence register of FIG. 2.

FIG. 4A is a diagram illustrating threshold voltage distributions of memory cells which are normally program-completed.

FIG. 4B is a diagram illustrating threshold voltage distributions of memory cells which are intentionally program-failed in accordance with the embodiment.

FIG. 5 is a flow chart describing a method for operating a data storage device in accordance with an embodiment of the present disclosure.

FIG. 10 is a diagram illustrating a network system including a data storage apparatus according to an embodiment of the present disclosure.

DETAILED DESCRIPTION

Figure 1:
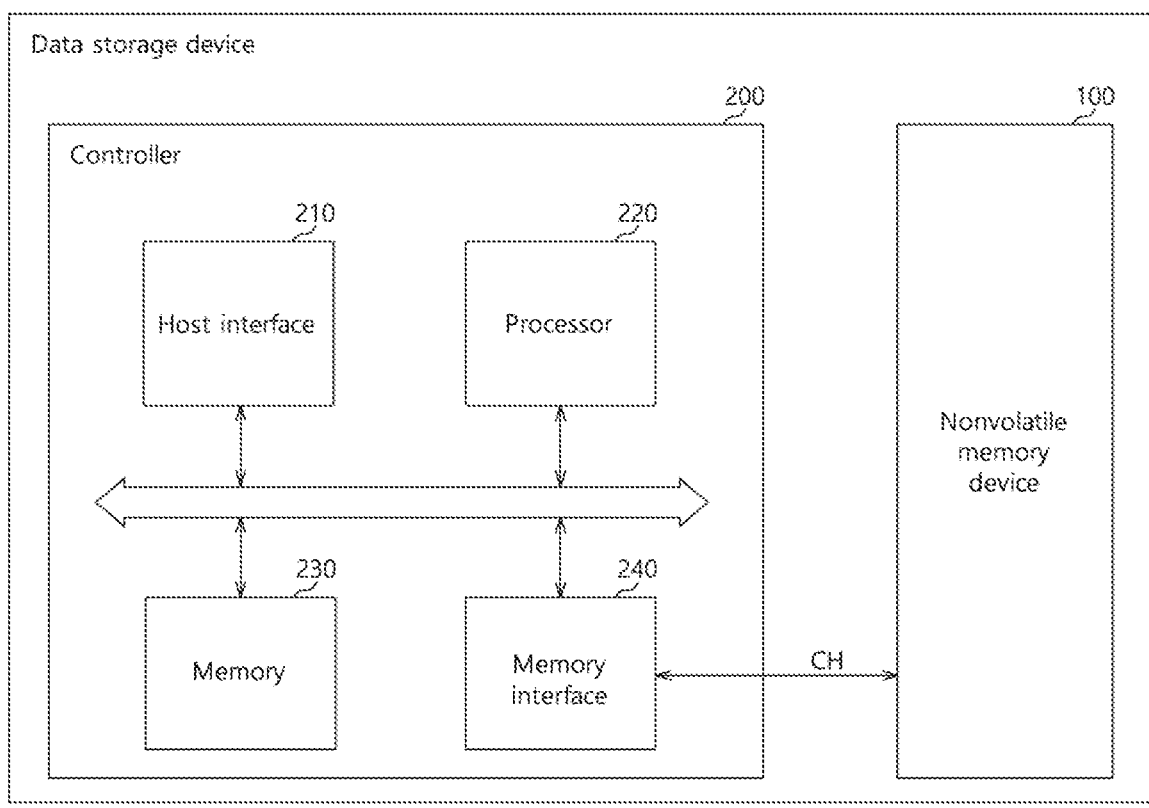
FIG. 1 is a block diagram illustrating a configuration of a data storage device in accordance with an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The phrase "at least one of . . . and . . . ," when used herein with a list of items, means a single item from the list or any combination of items in the list. For example, "at least one of A, B, and C" means, only A, or only B, or only C, or any combination of A, B, and C.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, a nonvolatile memory device, an operating method thereof and a data storage device including the same will be described below with reference to the accompanying drawings through various examples of embodiments.

FIG. 1 is a block diagram illustrating a configuration of a data storage device 10 in accordance with an embodiment.

The data storage device 10 may store data to be accessed by a host device (not shown) such as a mobile phone, an MP3 player, a laptop computer, a desktop computer, a game player, a TV, an in-vehicle infotainment system, and so forth. The data storage device 10 may also be referred to as a memory system.

The data storage device 10 may be manufactured as any one of various kinds of storage devices according to a host interface meaning a transmission protocol with respect to the host device. By way of example and not limitation, the data storage device 10 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-e or PCIe) card type storage device, a compact flash (CF) card, a smart media card, a memory stick, and so forth.

The data storage device 10 may be manufactured as any one among various kinds of package types. By way of example and not limitation, the data storage device 10 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the data storage device 10 may include a nonvolatile memory device 100 and a controller 200. Detailed description of the controller 200, including a host interface 210, a processor 220, a memory 230, and a memory interface 240, will be made later in this disclosure.

The nonvolatile memory device 100 may operate as the storage medium of the data storage device 10. The nonvolatile memory device 100 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on memory cells.

While FIG. 1 illustrates that the data storage device 10 includes one nonvolatile memory device 100, this is only for the sake of convenience in explanation, and the data storage device 10 may include a plurality of nonvolatile memory devices. The present embodiment may be applied in the same manner to a data storage device which includes a plurality of nonvolatile memory devices.

Figure 2:
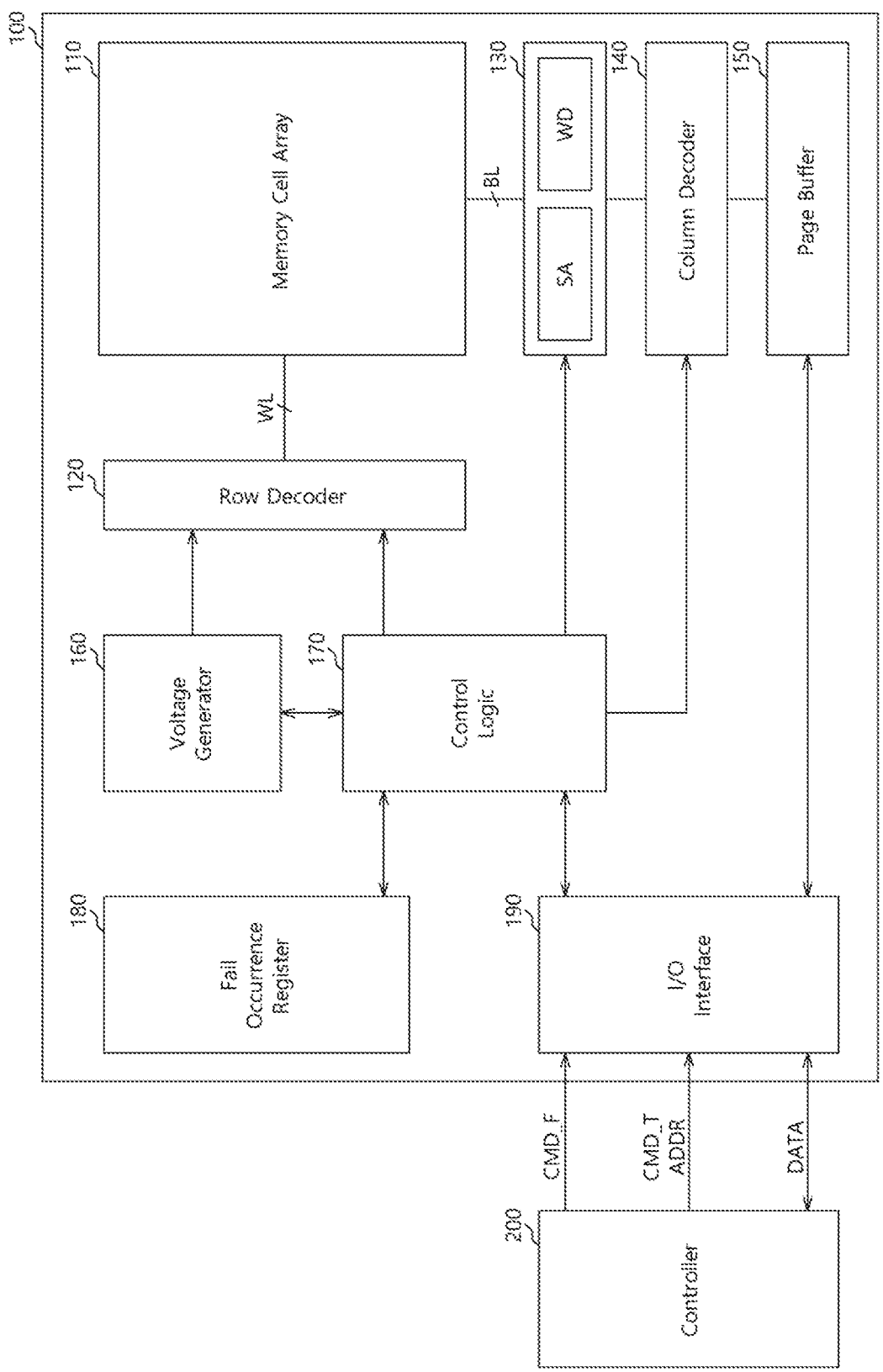
FIG. 2 is a diagram illustrating a configuration of a nonvolatile memory device.

FIG. 2 is a diagram illustrating a configuration of the nonvolatile memory device 100.

The nonvolatile memory device 100 may include a memory cell array 110, a row decoder 120, a data read/write circuit 130, a column decoder 140, a page buffer 150, a voltage generator 160, a control logic 170, a fail occurrence register 180 and an input/output interface 190. The row decoder 120, the data read/write circuit 130, the column decoder 140, the page buffer 150 and the voltage generator 160 are collectively referred to as a peripheral circuit.

The memory cell array 110 may include a plurality of memory cells which are respectively disposed at regions where a plurality of bit lines BL and a plurality of word lines WL intersect with each other. The memory cell array 110 may include a plurality of memory blocks, and each of the plurality of memory blocks may include a plurality of pages.

For example, each memory cell of the memory cell array 110 may be a single level cell (SLC) storing one bit, a multi-level cell (MLC) capable of storing 2-bit data, a triple level cell (TLC) capable of storing 3-bit data or a quadruple level cell (QLC) capable of storing 4-bit data. The memory cell array 110 may include at least ones among single level cells, multi-level cells, triple level cells and quadruple level cells. For example, the memory cell array 110 may include memory cells of a 2-dimensional horizontal structure or memory cells of a 3-dimensional vertical structure.

The row decoder 120 may be coupled with the memory cell array 110 through the word lines WL. The row decoder 120 may operate according to the control of the control logic 170. The row decoder 120 may decode a row address provided from an external device, that is, the controller 200, and may select and drive the word lines WL based on a decoding result. The row decoder 120 may provide a word line voltage provided from the voltage generator 160, to a selected word line WL.

The data read/write circuit 130 may be coupled with the memory cell array 110 through the bit lines BL. The data read/write circuit 130 may include read/write circuits (not shown) corresponding to the bit lines BL, respectively. The data read/write circuit 130 may operate according to the control of the control logic 170. The data read/write circuit 130 may operate as a write driver WD or a sense amplifier SA depending on an operation mode. The data read/write circuit 130 may operate in a write operation as the write driver WD which stores data provided from the external device, in the memory cell array 110. The data read/write circuit 130 may operate in a read operation as the sense amplifier SA which reads out data from the memory cell array 110.

The column decoder 140 may operate according to the control of the control logic 170. The column decoder 140 may decode a column address provided from the controller 200. The column decoder 140 may couple the read/write circuits of the data read/write circuit 130 corresponding to the bit lines BL, respectively, with the page buffer 150, based on a decoding result.

The page buffer 150 may be configured to temporarily store write data to be provided from the controller 200 and be stored in the memory cell array 110 or read data to be read out from the memory cell array 110 and be provided to the controller 200. The page buffer 150 may operate according to the control of the control logic 170.

The voltage generator 160 may generate voltages to be used in internal operations of the nonvolatile memory device 100. The voltage generator 160 may generate voltages to be used in internal operations of the nonvolatile memory device 100, by using a power source applied from the host device, and may provide the generated voltages to the memory cell array 110, the peripheral circuit (peri) and the control logic 170. The voltages generated by the voltage generator 160 may be applied to the memory cells of the memory cell array 110. A write voltage generated in a write operation may be applied to the word line WL of memory cells for which the write operation is to be performed. An erase voltage generated in an erase operation may be applied to the well region of memory cells for which the erase operation is to be performed. A read voltage generated in a read operation may be applied to the word line WL of memory cells for which the read operation is to be performed.

The control logic 170 may control general operations of the nonvolatile memory device 100, based on the control signals provided from the controller 200. For example, the control logic 170 may control read, write and erase operations of the nonvolatile memory device 100 according to a read command, a write command and an erase command provided from the controller 200.

The fail occurrence register 180 may be configured to store fail occurrence information such as whether to cause a fail to occur, a fail operation type and a fail condition, based on a fail occurrence command CMD_F received from the controller 200. The fail occurrence register 180 may store the fail occurrence information by the control of the control logic 170.

The input/output interface 190 may be configured to receive a command, an address and data provided from the controller 200 or provide data read out from the memory cell array 110 and a state information to the controller 200. The input/output interface 190 may output a command and an address provided from the controller 200, to the control logic 170, and output data provided from the controller 200, to the page buffer 150. The input/output interface 190 may operate according to the control of the control logic 170.

FIG. 3 is a diagram illustrating a configuration of the fail occurrence register 180 of FIG. 2.

The fail occurrence register 180 may be configured by a fail flag bit region where a value for setting whether to cause a fail to occur is stored, a fail operation type region where a type of an operation to cause a fail to occur is stored, and a fail condition region where conditions to cause a fail to occur are stored.

The fail flag bit region may store bit value of 'set' or 'reset'. For example, in the case where the fail flag bit region stores the bit value of a 'set', the control logic 170 may control the nonvolatile memory device 100 to cause a fail to occur during its operation. In the case where the fail flag bit region store the bit value of a 'reset', the control logic 170 may control the operation of the nonvolatile memory device 100 to operate normally.

In the fail operation type region, a value indicating an operation code may be stored. For example, in the fail operation type region, an operation code indicating a write operation, an operation code indicating an erase operation, an operation code indicating a read operation, and so forth may be stored.

In the fail condition region, a value indicating conditions for causing a fail to occur may be stored. By way of example and not limitation, as shown in FIG. 3, one or more conditions among various conditions such as a pulse count, a verify count, an operation time, a program voltage (PV) level, a verify voltage level and an uncorrectable error correction code (UECC) data output may be stored.

Referring back to FIG. 1, the controller 200 may include a host interface 210, a processor 220, a memory 230 and a memory interface 240.

The host interface 210 may interface the host device and the data storage device 10. For example, the host interface 210 may communicate with the host device by using any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-e or PCIe) protocols.

The processor 220 may be configured by a micro control unit (MCU) or a central processing unit (CPU). The processor 220 may process a request received from the host device. In order to process a request received from the host device, the processor 220 may drive a code type instruction or algorithm, that is, a software, loaded in the memory 230, and may control internal function blocks and the nonvolatile memory device 100.

The memory interface 240 may control the nonvolatile memory device 100 according to the control of the processor 220. The memory interface 240 may also be referred to as a memory controller. The memory interface 240 may provide control signals to the nonvolatile memory device 100. The control signals may include a command, an address and so forth, for controlling the operation of the nonvolatile memory device 100. The memory interface 240 may provide data to the nonvolatile memory device 100 or may be provided with data from the nonvolatile memory device 100. The memory interface 240 may be coupled with the nonvolatile memory device 100 through a channel CH including one or more signal lines.

The memory 230 may be configured by a random access memory such as a dynamic random access memory (DRAM) or a static random access memory (SRAM). The memory 230 may temporarily store data to be transmitted from the host device to the nonvolatile memory device 100 or from the nonvolatile memory device 100 to the host device. In other words, the memory 230 may operate as a data buffer memory or a data cache memory.

The memory 230 may store a software to be driven by the processor 220. Also, the memory 230 may store data (for example, metadata) necessary for driving the software. Namely, the memory 230 may operate as a working memory of the processor 220. A software which is stored in the memory 230 and is driven by the processor 220 is referred to as a flash translation layer (FTL).

In the case where the nonvolatile memory device 100 is configured by a flash memory device, the processor 220 may drive a software referred to as a flash translation layer (FTL), to control intrinsic operations of the nonvolatile memory device 100 and provide device compatibility to the host device. Through driving of such a flash translation layer (FTL), the host device may recognize and use the data storage device 10 as a general data storage device such as a hard disk.

The flash translation layer (FTL) stored in the memory 230 may be configured by modules for performing various functions and metadata necessary for driving the modules. The flash translation layer (FTL) may be stored in the system region (not shown) of the nonvolatile memory device 100, and may be loaded in the memory 230 when the data storage device 10 is powered on.

The flash translation layer (FTL) is configured to process various fails which occur in the nonvolatile memory device 100. In the nonvolatile memory device 100, various fails occur during operation. By way of example and not limitation, the various fails may include a program fail, a read fail or an erase fail may occur. A flash translation layer (FTL) verification test may be performed for verifying whether the flash translation layer (FTL) normally, i.e., in an intended manner, processes a fail when the fail occurs in the nonvolatile memory device 100.

In a first test scheme for verifying the flash translation layer (FTL), the nonvolatile memory device 100 is controlled to repeatedly perform, until a fail desired to be tested in the nonvolatile memory device 100 occurs, an operation to cause the desired fail. In a second test scheme for verifying the flash translation layer (FTL), the flash translation layer (FTL) may determine that a fail has occurred in the nonvolatile memory device 100 although the fail does not actually occur. In both schemes, the flash translation layer (FTL) processes the fail and the verification is made according to a result of the process.

In the first test scheme, while an accurate verification is possible, a problem may be encountered in that a test time increases. In the second test scheme, while a test time is short, various problems may be encountered due to the fact that a cell region processed as a fail by the flash translation layer (FTL) is actually not a cell region where a fail has occurred.

Descriptions will be made show the problems of the second test scheme by taking as an example a case of verifying a subsequent processing procedure of the flash translation layer (FTL) for an erase fail or a program fail. The flash translation layer (FTL) provides an erase command (or a program command) for an optional first memory block to the nonvolatile memory device 100 based on a request from the host device (for example, test equipment). The nonvolatile memory device 100 performs an erase operation (or a program operation) for the first memory block according to the provided erase command (or program command), and transmits a state information indicating an erase pass (or a program pass) to the controller 200 when the erase operation (or the program operation) is completed.

According to the second test scheme, even though the state information indicating the erase pass (or the program pass) is received from the nonvolatile memory device 100, the flash translation layer (FTL) determines an erase fail (or a program fail) has occurred in the nonvolatile memory device 100 and classifies the first memory block as a bad block, and stores and provides an information indicating that the first memory block is a bad block, in the memory 230 and to the host device. At this time, if a situation such as a sudden power off (SPO) occurs, as the information stored in the memory 230 are erased, the information indicating that the first memory block is a bad block may be erased as well.

As the information indicating the first memory block as a bad block is erased from the memory 230, in a rebuild operation that is performed after the power recovery of the data storage device 10, the flash translation layer (FTL) regards the first memory block for which the erase operation is completed, as a normal block, and uses the first memory block in a write operation. Otherwise, in the rebuild operation, as the data programmed in the first memory block are normally recovered, the flash translation layer (FTL) normally reads data from the first memory block.

That is, an error may occur in that, although, even after the rebuild operation, the host device recognizes the first memory block as a bad block according to the information provided from the flash translation layer (FTL), the flash translation layer (FTL) regards and uses the first memory block as a normal block. Due to this fact, a problem of accurately verifying the flash translation layer (FTL) may occur according to the second test scheme.

In the present embodiment, the processor 220 of the controller 200 transmits the fail occurrence command CMD_F for causing a desired fail to be verified to occur in the nonvolatile memory device 100, and the nonvolatile memory device 100 stores information for causing the desired fail to occur in the fail occurrence register 180, based on the received fail occurrence command CMD_F. Thereafter, the processor 220 transmits a test operation command CMD_T to the nonvolatile memory device 100, and the control logic 170 of the nonvolatile memory device 100 controls the nonvolatile memory device 100 to perform a test operation. The control logic 170 checks the fail occurrence information by referring to the fail occurrence register 180, and thereby determines whether to cause an intentional fail to occur.

For example, it is assumed that the fail flag bit region is set as 'set', a write operation code indicating a write operation is stored in the fail operation type region and an information to cause a fail to occur when a first verification voltage $V_{vrf1}$ is passed is stored in the fail condition region in the fail occurrence register 180, and it is assumed that the test operation command CMD_T is a write operation command.

In such a case, the control logic 170 controls the operation of the nonvolatile memory device 100 such that the write operation is performed in the nonvolatile memory device 100 in response to the test operation command CMD_T, and controls the operation of the nonvolatile memory device 100 such that the write operation is interrupted when the first verification voltage $V_{vrf1}$ is passed, according to the fail condition region stored in the fail occurrence register 180. Due to this fact, the write operation corresponding to the test operation command CMD_T is actually put into an interrupted state in its performance, and the control logic 170 reports to the controller 200 that a program fail has occurred.

FIG. 4A is a diagram illustrating threshold voltage distributions of memory cells which are normally program-completed, and FIG. 4B is a diagram illustrating threshold voltage distributions of memory cells which are intentionally program-failed in accordance with the embodiment. While multi-level cells (MLC) are shown as an example in FIGS. 4A and 4B, it is to be noted that the embodiment is not limited specifically thereto. In FIGS. 4A and 4B, the solid lines represent threshold voltage distributions which are formed and the dotted lines represent threshold voltage distributions which are not formed.

In the case where program is normally completed, as shown in FIG. 4A, all of first to fourth threshold voltage distributions PV0 to PV3 may be formed. Conversely, in the case where program is intentionally interrupted at a specific fail condition (that is, the write operation is interrupted when the first verification voltage $V_{vrf1}$ is passed) as described above, as shown in FIG. 4B, only first and second threshold voltage distributions PV0 and PV1 may be formed, and third and fourth threshold voltage distributions PV2 and PV3 may not be formed. In other words, a program-interrupted fail state may actually occur.

For another example, it is assumed that the fail flag bit region is set as 'set', an erase operation code indicating an erase operation is stored in the fail operation type region and an information to cause a fail to occur at an n^th erase pulse count (n is an integer of 1 or more) is stored in the fail condition region of the fail occurrence register 180, and it is assumed that the test operation command CMD_T is an erase operation command.

In such a case, the control logic 170 controls the operation of the nonvolatile memory device 100 such that the erase operation is performed in the nonvolatile memory device 100 in response to the test operation command CMD_T, and controls the operation of the nonvolatile memory device 100 such that the erase operation is interrupted after the n^th erase pulse count is applied, according to the fail condition region stored in the fail occurrence register 180. As a result, the erase operation corresponding to the test operation command CMD_T is actually put into an interrupted state in its performance, and the control logic 170 reports to the controller 200 that an erase fail has occurred.

For still another example, it is assumed that the fail flag bit region is set as 'set', a read operation code indicating a read operation is stored in the fail operation type region and an information to cause uncorrectable ECC (UECC) data to be outputted is stored in the fail condition region of the fail occurrence register 180, and it is assumed that the test operation command CMD_T is a read operation command.

In such a case, the control logic 170 controls the operation of the nonvolatile memory device 100 such that the read operation is performed in the nonvolatile memory device 100 in response to the test operation command CMD_T, inverts some bits of read data read out from the memory cell array 110, according to the fail condition region stored in the fail occurrence register 180, and provides the read data with some inverted bits to the controller 200.

Namely, in the present embodiment, when verifying the flash translation layer FTL, the nonvolatile memory device 100 is brought into a state in which a fail has actually occurred, by using the fail occurrence command CMD_F.

FIG. 5 is a flow chart describing a method for operating a data storage device in accordance with an embodiment. In explaining the method for operating a data storage device in accordance with the embodiment, references will be made to FIGS. 1 to 3.

At step S401, the controller 200 may transmit the fail occurrence command CMD_F to the nonvolatile memory device 100. For example, the controller 200 may generate the fail occurrence command CMD_F based on a fail occurrence request provided by a tester, and provide the generated fail occurrence command CMD_F to the nonvolatile memory device 100. The tester may be a test apparatus for testing an operation of the flash translation layer (FTL).

At step S403, the control logic 170 (see FIG. 2) of the nonvolatile memory device 100 may store fail occurrence information in the fail occurrence register 180 (see FIG. 2), based on the fail occurrence command CMD_F transmitted from the controller 200. Since detailed descriptions were made above for the fail occurrence information, further descriptions thereof will be omitted herein.

At step S405, the controller 200 may transmit the test operation command CMD_T to the nonvolatile memory device 100. For example, the controller 200 may generate the test operation command CMD_T based on a test request provided by the tester, and provide the generated test operation command CMD_T to the nonvolatile memory device 100.

At step S407, the control logic 170 of the nonvolatile memory device 100 may control the nonvolatile memory device 100 to perform an operation corresponding to the test operation command CMD_T transmitted from the controller 200.

At step S409, the control logic 170 of the nonvolatile memory device 100 may check the fail occurrence information stored in the fail occurrence register 180. For example, the control logic 170 may check the fail occurrence information stored in the fail occurrence register 180. For example, the control logic 170 may check a fail flag bit region, a fail operation type region and a fail condition region of the occurrence register 180.

At step S411, the control logic 170 of the nonvolatile memory device 100 may interrupt the operation which is being performed in response to the test operation command CMD_T or invert some bits of read data read out from the memory cell array 110, according to the fail condition region checked at the step S409.

At step S413, the control logic 170 may report the occurrence of a fail to the controller 200 or transmits the read data with some inverted bits to the controller 200, by controlling the input/output interface 190.

Figure 6:
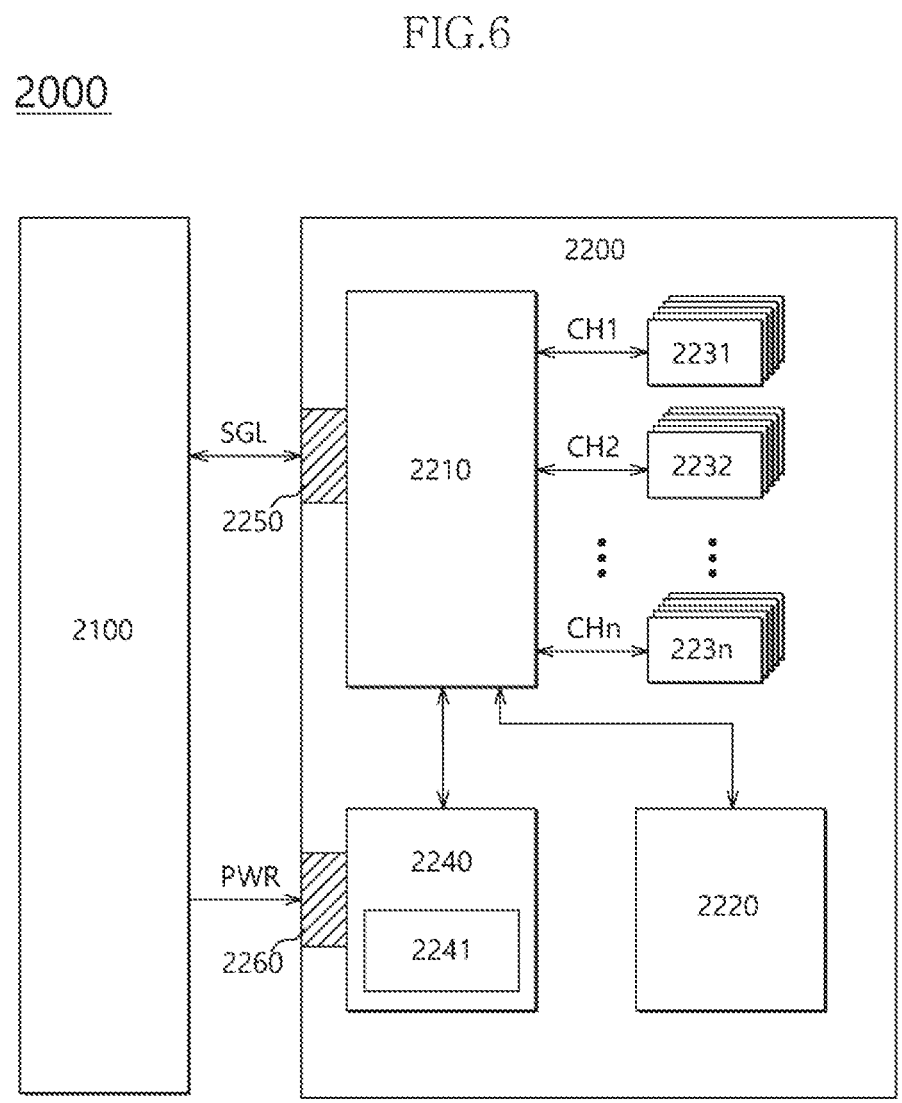
FIG. 6 is a diagram illustrating a data processing system including a solid state drive (SSD) according to an embodiment of the is present disclosure.

FIG. 6 is a diagram illustrating a data processing system including a solid state drive (SSD) according to an embodiment. Referring to FIG. 6, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 7:
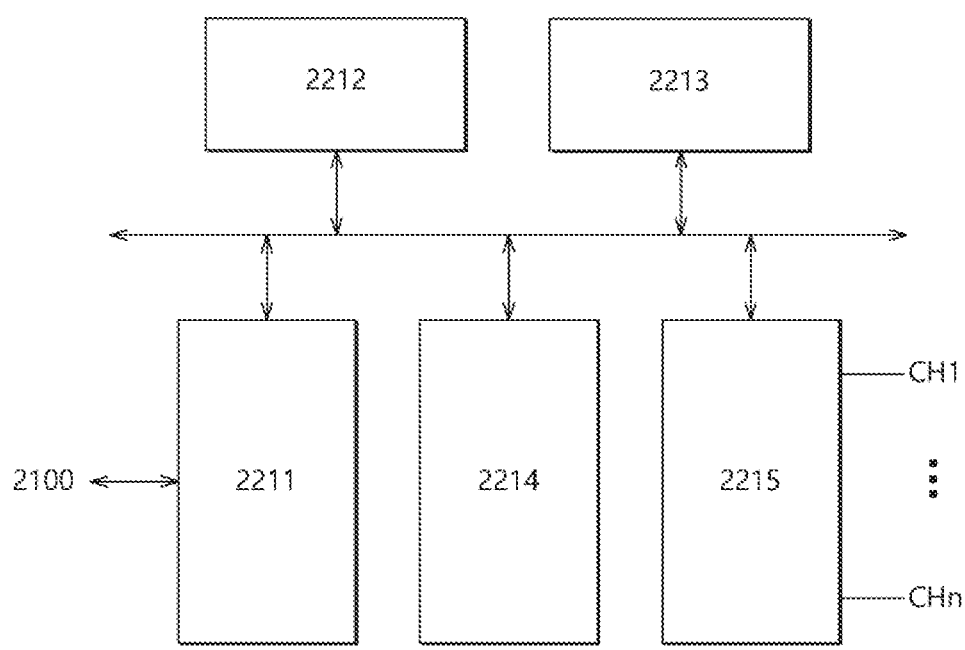
FIG. 7 is a diagram illustrating a controller illustrated in FIG. 9.

FIG. 7 is a diagram illustrating the controller 2210 of FIG. 6. Referring to FIG. 7, the controller 2210 may include a host interface 2211, a controller 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (DATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-e or PCIe) protocol, and a universal flash storage (UFS) protocol. The host interface 2211 may perform a disc emulation function that the host apparatus 2100 recognizes the SSD 2200 as a general-purpose data storage apparatus, for example, a hard disc drive HDD.

The controller 2212 may analyze and process the signal SGL input from the host apparatus 2100. The controller 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the controller 2212. The memory interface 2215 may exchange data with the nonvolatile memory devices 2231 to 223n according to control of the controller 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 8:
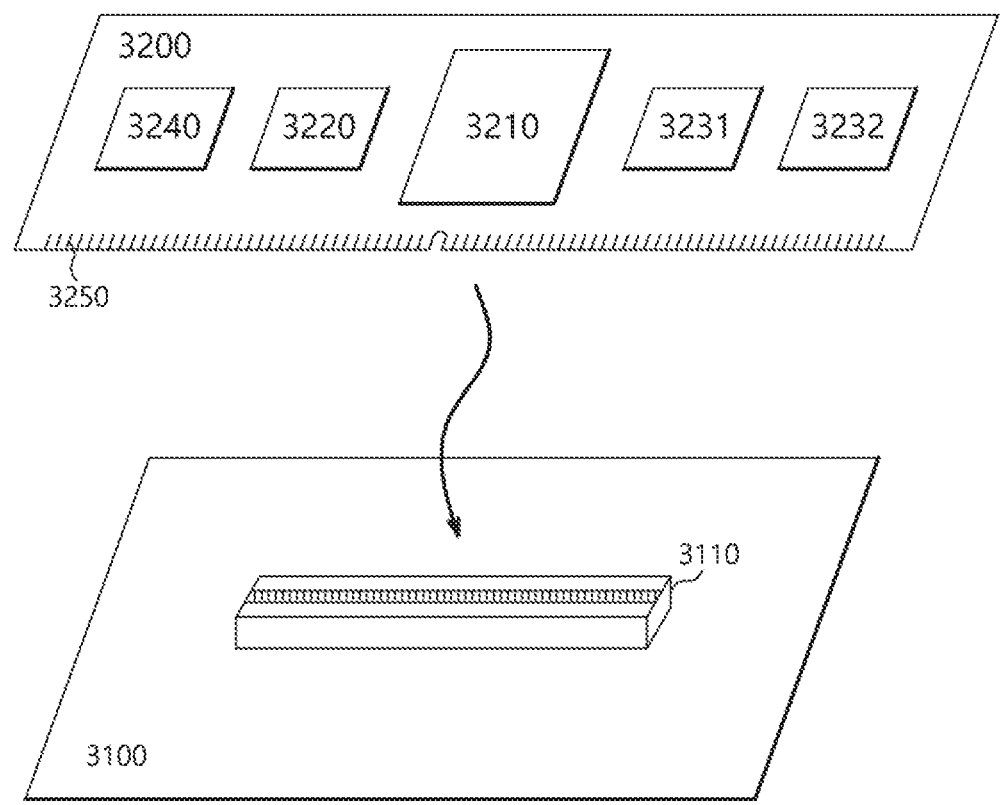
FIG. 8 is a diagram illustrating a data processing system including a data storage apparatus according to an embodiment of the present disclosure.

FIG. 8 is a diagram illustrating a data processing system including a data storage apparatus according to an embodiment. Referring to FIG. 8, a data processing system 3000 may include a host apparatus 3100 and a data storage apparatus 3200.

The host apparatus 3100 may be configured in a board form such as a printed circuit board (PCB). Although not shown in FIG. 8, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 210 may control an overall operation of the data storage apparatus 3200. The controller 3210 may be configured to have the same configuration as the controller 2210 illustrated in FIG. 7.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 9:
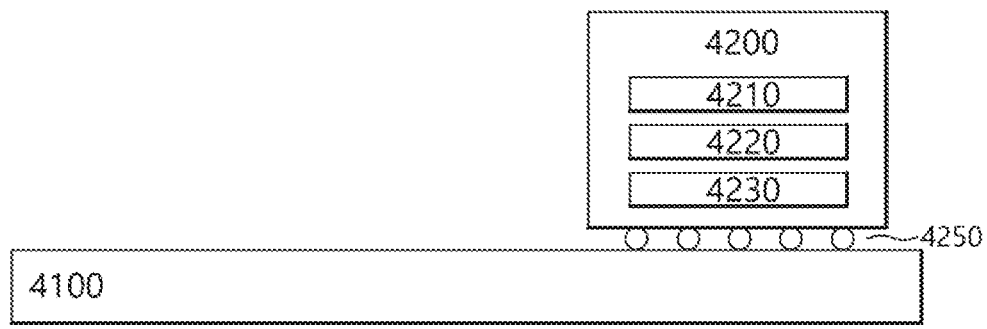
FIG. 9 is a diagram illustrating a data processing system including a data storage apparatus according to an embodiment of the present disclosure.

FIG. 9 is a diagram illustrating a data processing system including a data storage apparatus according to an embodiment. Referring to FIG. 9, a data processing system 4000 may include a host apparatus 4100 and a data storage apparatus 4200.

The host apparatus 4100 may be configured in a board form such as a PCB. Although not shown in FIG. 9, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 7.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

FIG. 10 is a diagram illustrating a network system 5000 including a data storage apparatus according to an embodiment. Referring to FIG. 10, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage device 10 of FIG. 1, the data storage apparatus 2200 of FIG. 6, the data storage apparatus 3200 of FIG. 8, or the data storage apparatus 4200 of FIG. 9.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A nonvolatile memory device comprising:
a memory cell array;
a peripheral circuit configured to perform an operation corresponding to a command provided from an external device, for the memory cell array;
a fail occurrence register configured to store fail occurrence information for intentionally causing an operation fail to occur; and
a control logic configured to:
store the fail occurrence information in the fail occurrence register based on a fail occurrence command received from the external device;
control the peripheral circuit to perform a test operation corresponding to a test operation command received from the external device, for the memory cell array; and
control the peripheral circuit to cause an intentional fail to occur in the test operation, based on the fail occurrence information.

2. The nonvolatile memory device according to claim 1, wherein the fail occurrence register is configured by a first region where a value for setting whether to cause a fail to occur is stored, a second region where a type of an operation to cause the fail to occur is stored and a third region where a value indicating a fail occurrence condition is stored.

3. The nonvolatile memory device according to claim 2, wherein the fail occurrence condition includes one or more among a pulse count, a verify count, an operation time, a program voltage level, a verify voltage level and an uncorrectable error correction code (UECC) read data output.

4. The nonvolatile memory device according to claim 3, wherein the control logic interrupts, when the fail occurrence condition includes one or more among the pulse count, the verify count, the operation time, the program voltage level and the verify voltage level, performance of the test operation and reports occurrence of a fail to the external device, at a point of time when the fail occurrence condition is satisfied.

5. The nonvolatile memory device according to claim 3, wherein the control logic inverts, when the fail occurrence condition includes the UECC read data output, some bits of read data read out from the memory cell array by the test operation and transmits the read data with some inverted bits to the external device.

6. A data storage device including a nonvolatile memory device and a controller which controls an operation of the nonvolatile memory device, the nonvolatile memory device comprising:
a memory cell array;
a peripheral circuit configured to perform an operation corresponding to a command provided from an external device, for the memory cell array;
a fail occurrence register configured to store fail occurrence information for intentionally causing an operation fail to occur; and
a control logic configured to:
store the fail occurrence information in the fail occurrence register based on a fail occurrence command received from the controller;
control the peripheral circuit to perform a test operation corresponding to a test operation command received from the controller, for the memory cell array; and
control the peripheral circuit to cause an intentional fail to occur in the test operation, based on the fail occurrence information.

7. The data storage device according to claim 6, wherein the fail occurrence register is configured by a first region where a value for setting whether to cause a fail to occur is stored, a second region where a type of an operation to cause the fail to occur is stored and a third region where a value indicating a fail occurrence condition is stored.

8. The data storage device according to claim 7, wherein the fail occurrence condition includes one or more among a pulse count, a verify count, an operation time, a program voltage level, a verify voltage level and an uncorrectable error correction code (UECC) read data output.

9. The data storage device according to claim 8, wherein the control logic interrupts, when the fail occurrence condition includes one or more among the pulse count, the verify count, the operation time, the program voltage level and the verify voltage level, performance of the test operation and reports occurrence of a fail to the controller, at a point of time when the fail occurrence condition is satisfied.

10. The data storage device according to claim 8, wherein the control logic inverts, when the fail occurrence condition includes the UECC read data output, some bits of read data read out from the memory cell array by the test operation and transmits the read data with some inverted bits to the controller.

* * * * *